United States Patent
Chiang

(10) Patent No.: US 11,456,324 B2
(45) Date of Patent: Sep. 27, 2022

(54) IMAGE SENSOR PACKAGE

(71) Applicant: Spring Rainbow Optics Co., LTD, Taoyuan (TW)

(72) Inventor: Po-Liang Chiang, Taipei (TW)

(73) Assignee: SPRING RAINBOW OPTICS CO., LTD, Taoyuan (TW)

( * ) Notice: Subject to any disclaimer, the term of this patent is extended or adjusted under 35 U.S.C. 154(b) by 202 days.

(21) Appl. No.: 16/880,425

(22) Filed: May 21, 2020

(65) Prior Publication Data

US 2020/0373342 A1 Nov. 26, 2020

Related U.S. Application Data

(60) Provisional application No. 62/852,332, filed on May 24, 2019.

(51) Int. Cl.
*H01L 27/146* (2006.01)
(52) U.S. Cl.
CPC .. *H01L 27/14618* (2013.01); *H01L 27/14612* (2013.01)

(58) Field of Classification Search
CPC ... H01L 27/14–14893; H01L 27/14612; H01L 27/14618
See application file for complete search history.

(56) References Cited

U.S. PATENT DOCUMENTS

| | | | | |
|---|---|---|---|---|
| 6,531,341 B1 * | 3/2003 | Peterson | ............. | H01L 27/1469 257/E21.705 |
| 6,661,084 B1 * | 12/2003 | Peterson | ................. | H01L 23/10 257/737 |
| 6,674,159 B1 * | 1/2004 | Peterson | ........... | H01L 27/14618 257/434 |

OTHER PUBLICATIONS

Takashi, 2005, EP 1605519 A2.*

* cited by examiner

*Primary Examiner* — Suberr L Chi
(74) *Attorney, Agent, or Firm* — WPAT, PC

(57) ABSTRACT

An image sensor package includes a plastic packaging structure; and a transparent plastic window disposed in the plastic packaging structure, wherein material of the transparent plastic window includes plastic and an additive, and the additive is selected from the group consisting of germanium, silicon, potassium bromide, potassium chloride, sodium chloride, zinc sulfide, and zinc selenide.

20 Claims, 2 Drawing Sheets

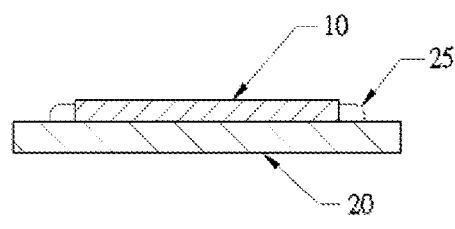 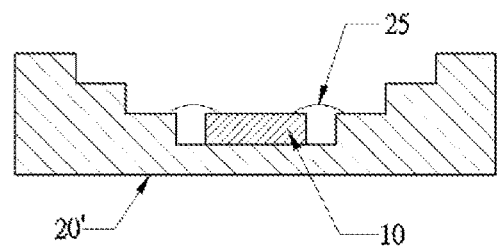
FIG.1A  FIG.1B
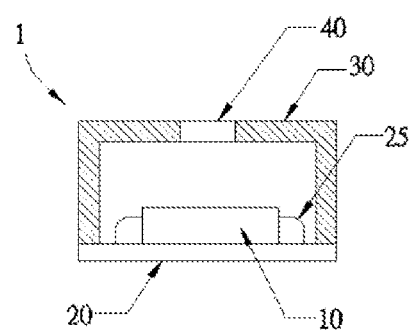 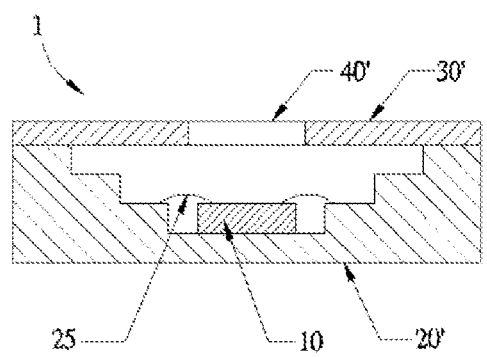
FIG.2A  FIG.2B
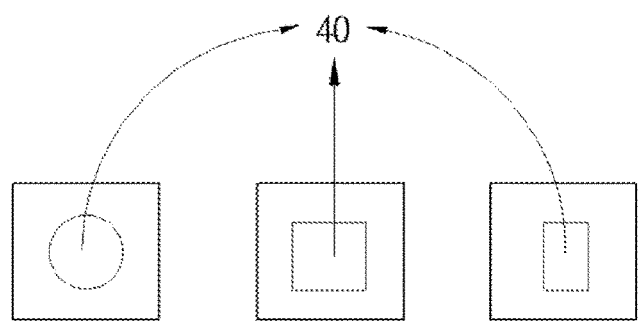
FIG. 3

IMAGE SENSOR PACKAGE

CROSS REFERENCE TO RELATED APPLICATIONS

The present application claims the benefit of priority under 35 USC 119(e) of U.S. Provisional Patent Application No. 62/852,332 entitled "IMAGE SENSOR AND PACKAGE" and filed on May 24, 2019, the contents of which are incorporated herein by reference in their entirety.

FIELD OF INVENTION

The present disclosure relates to the technical field of cameras, and particularly to an image sensor package, main material of which is plastic.

BACKGROUND OF DISCLOSURE

Surface package materials of most image sensors, such as a complementary metal oxide semiconductor (CMOS) or a charge coupled device (CCD), are mostly made of metal or ceramic, and based on the operating spectrum, glass (for the visible and near infrared and near ultraviolet regions) or other materials, such as silicon, germanium, and zinc (for a far infrared region) is used to form a window, through which light can penetrate, on a packaging structure.

In addition, in order to improve the performance of some image sensors, inside of the package is necessary in a vacuum condition, or is filled with special gas which is non-general air, such as nitrogen, helium, or a oxygen-free or low-oxygen mixture gas, to reduce heat transmission affecting the image sensor through contact conduction and air convection, so that the image sensor only receives thermal radiation and has the most sensitive sensing effect.

However, material costs of metal, ceramic and glass are relatively high, and the process of maintaining the vacuum condition inside the package is complicated. Therefore, it is necessary to provide an image sensor package having advantages of low costs, a simple manufacturing process while maintaining decent light transmittance of a window.

SUMMARY OF INVENTION

A primary object of the present disclosure is to provide an image sensor package having advantages of low costs, a simple manufacturing process while maintaining decent light transmittance of a window.

To achieve the above object, an aspect of the present disclosure provides an image sensor package, including:

a plastic packaging structure; and a transparent plastic window disposed in the plastic packaging structure, wherein a material of the transparent plastic window includes a plastic and an additive, and the additive is selected from the group consisting of germanium, silicon, potassium bromide, potassium chloride, sodium chloride, zinc sulfide, and zinc selenide.

In accordance with an embodiment of the present disclosure, inside of the image sensor package is not vacuum and contains a gas.

In accordance with an embodiment of the present disclosure, a material of the plastic packaging structure includes a plastic, and the plastics of the plastic packaging structure and the transparent plastic window are selected from the group consisting of polycarbonate (PC), polymethyl methacrylate (PMMA), polyethylene (PE), high density polyethylene (HDPE), polypropylene (PP), polystyrene (PS), polyethylene terephthalate (PET).

In accordance with an embodiment of the present disclosure, a mass percentage of the additive to the transparent plastic window ranges from 2% to 10%.

In accordance with an embodiment of the present disclosure, a top surface and a bottom surface of the transparent plastic window are planes, aspheric curved surfaces or Fresnel curved surfaces.

In accordance with an embodiment of the present disclosure, shapes of a top surface and a bottom surface of the transparent plastic window are circles, squares or rectangles.

In accordance with an embodiment of the present disclosure, the plastic packaging structure includes an upper structure including more than one air holes configured to adjust a type and pressure of the gas contained inside the image sensor package.

In accordance with an embodiment of the present disclosure, the plastic packaging structure includes an upper structure including a shutter configured to allow and block light from entering the image sensor package, or a band pass filter, wherein the shutter or the band pass filter is disposed on an inner side and an outer side of the upper structure.

In accordance with an embodiment of the present disclosure, the plastic packaging structure includes an upper structure including more than one positioning recesses or positioning protrusions configured to position the image sensor package in place.

In accordance with an embodiment of the present disclosure, the plastic packaging structure includes a lateral side, and the lateral side includes more than one positioning grooves.

To achieve the above object, an aspect of the present disclosure provides an image sensor package, including:

a substrate configured to carry the image sensor, a plastic packaging structure disposed on the substrate and surrounding the image sensor; and a transparent plastic window disposed in the plastic packaging structure, and located directly above the image sensor, wherein a position of the transparent plastic window projected on the substrate corresponds to a position of the image sensor, and a material of the transparent plastic window includes a plastic and an additive, and the additive is selected from the group consisting of germanium, silicon, potassium bromide, potassium chloride, sodium chloride, zinc sulfide, and zinc selenide.

In accordance with an embodiment of the present disclosure, inside of the image sensor package is not vacuum and contains a gas.

In accordance with an embodiment of the present disclosure, a material of the plastic packaging structure includes a plastic, and the plastics of the plastic packaging structure and the transparent plastic window are selected from the group consisting of polycarbonate (PC), polymethyl methacrylate (PMMA), polyethylene (PE), high density polyethylene (HDPE), polypropylene (PP), polystyrene (PS), polyethylene terephthalate (PET).

In accordance with an embodiment of the present disclosure, a mass percentage of the additive to the transparent plastic window ranges from 2% to 10%.

In accordance with an embodiment of the present disclosure, a top surface and a bottom surface of the transparent plastic window are planes, aspheric curved surfaces or Fresnel curved surfaces.

In accordance with an embodiment of the present disclosure, shapes of a top surface and a bottom surface of the transparent plastic window are circles, squares or rectangles.

In accordance with an embodiment of the present disclosure, the plastic packaging structure includes an upper structure, and the upper structure is substantially parallel to the substrate, is located above the image sensor, and includes more than one air holes configured to adjust a type and pressure of the gas contained inside the image sensor package.

In accordance with an embodiment of the present disclosure, the plastic packaging structure includes an upper structure, and the upper structure is substantially parallel to the substrate, is located above the image sensor, and includes a shutter configured to allow and block light from achieving the image sensor, or the band pass filter, wherein the shutter or the band pass filter is disposed on a side of the upper structure close to or away from the image sensor.

In accordance with an embodiment of the present disclosure, the plastic packaging structure includes an upper structure, and the upper structure is substantially parallel to the substrate, is located above the image sensor, and includes more than one positioning recesses or positioning protrusions configured to position the image sensor package in place.

In accordance with an embodiment of the present disclosure, the substrate and the plastic packaging structure are independent of each other, and materials of the substrate and the plastic packaging structure are different.

In summary, in accordance with an embodiment of the present disclosure, the image sensor package has the following three advantages: (1) plastic is used as the main package material for packaging the image sensor, and since plastic is cheep and can be easily formed, the cost is low, and the manufacturing process is fast; (2) the additive is added into the plastic to form a plastic mixture used as material of the transparent plastic window for making the image sensor have sufficient light transmittance in a far infrared region (e.g., 3-14 µm) (e.g., light transmittance exceeding 45%); (3) in a conventional image sensor package, air pressure in the space sealed inside the package must be controlled between 0 and 0.1 atmospheric pressure, but in the present disclosure, since plastic is used as the main material of the packaging structure, instead of common metals, and the thermal insulation effect of plastic on contact conduction is better than that of metals, the space sealed inside the package is unnecessary in the vacuum condition or unnecessarily filled with a special gas which is non-general air, thereby changing the packaging order in the supply chain.

BRIEF DESCRIPTION OF DRAWINGS

With reference to the following detailed description and in conjunction with the accompanying drawings, the foregoing aspects of the present disclosure and many accompanying advantages may be easily understood, wherein:

FIG. 1A and FIG. 1B are cross-sectional side views respectively showing two types of substrates to which image sensor packages are applicable in accordance with some embodiments of the present disclosure.

FIG. 2A and FIG. 2B are cross-sectional side views respectively showing structures after the image sensor packages are applied to the two substrates in accordance with some embodiments of the disclosure.

FIG. 3 is a top view showing a top view structure of three types of image sensor packages in accordance with some embodiments of the disclosure.

DETAILED DESCRIPTION OF PREFERRED EMBODIMENTS

Figure 4:
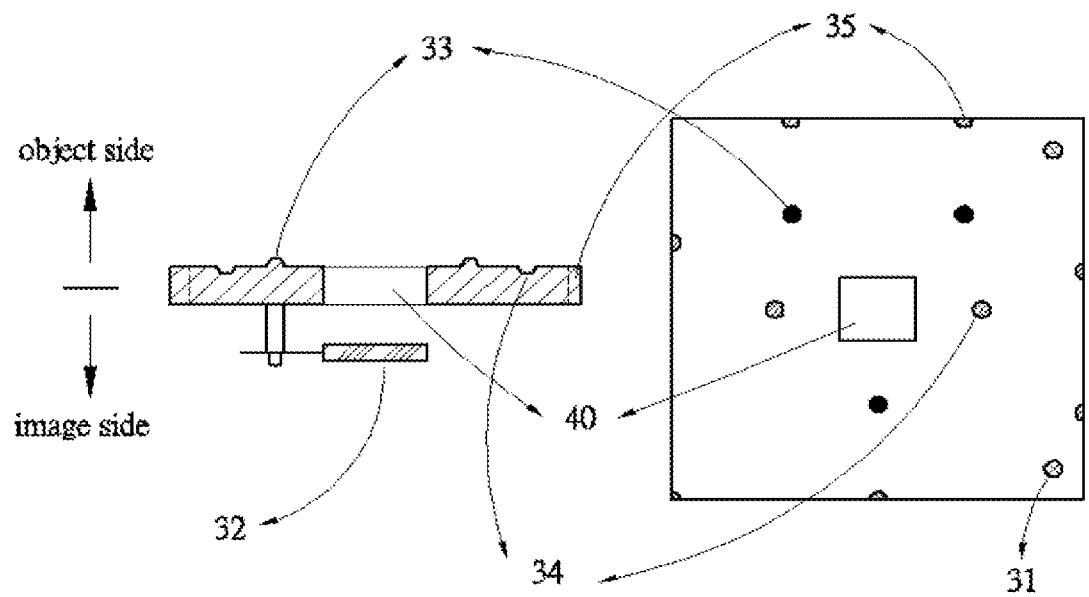
FIG. 4 is a cross-sectional side view (left part) and a top view (right part) showing a detailed structure of an image sensor package in accordance with an embodiment of the disclosure.

The following description of the embodiments with reference to the accompanying drawings is used to illustrate particular embodiments of the present disclosure. The directional terms used in the present disclosure, such as "upper", "lower", "front", "back", "left", "right", "inner", "outer", "side surface", etc., are only directions with regard to the accompanying drawings. Therefore, the directional terms used for describing and illustrating the present disclosure are not intended to limit the present disclosure.

In the drawings, units with similar structures are indicated by the same reference number.

As to an "embodiment" mentioned herein, the particular features, structures, or characteristics described in this embodiment, which may be described in combination with the embodiment, may be included in at least one embodiment of the present disclosure. The phrases appearing at various locations in the specification do not necessarily refer to the same embodiments, nor to the embodiments being alternative to, mutually exclusive with, or independent from other embodiments. It is explicitly and implicitly understood by a person of ordinary skill in the art that the embodiments described herein may be combined with other embodiments.

The content of the present disclosure is described in detail by reference to embodiments below in conjunction with the accompanying drawings.

By reference to the accompanying drawings, the technological content and embodiments of the present disclosure are described in detail as follows:

FIG. 1A and FIG. 1B are cross-sectional side views respectively showing two types of substrates 20, 20' to which image sensor packages 30, 30' are applicable in accordance with some embodiments of the present disclosure. FIG. 1A shows a plane substrate 20, and FIG. 2B shows a substrate 20' with multiple steps. However, these types are only exemplary embodiments, and the present disclosure is not limited to these two types of substrates 20, 20'. FIG. 2A and FIG. 2B are cross-sectional side views respectively showing possible structures after the image sensor packages 30, 30' are applied to two types of the substrates 20, 20' in accordance with some embodiments of the disclosure. The image sensor packages 30, 30' with different structures are applied to different types of the substrates 20, 20'. FIG. 2A shows an image sensor package 30 applied to the plane substrate 20, and FIG. 2A shows another image sensor package 30' applied to the substrate 20' with the multiple steps. However, these structures are only exemplary embodiments, and the present disclosure is not limited to these two package structures.

In accordance with an aspect of the present disclosure, the image sensor package 1 includes: a plastic packaging structure 30, 30'; and a transparent plastic window 40, 40' disposed in the plastic packaging structure 30, 30', wherein material of the transparent plastic window 40, 40' includes a plastic and an additive, and the additive is selected from the group consisting of germanium, silicon, potassium bromide, potassium chloride, sodium chloride, zinc sulfide, and zinc selenide.

In accordance with an aspect of the present disclosure, the image sensor package 1 disposed on a substrate 20 carrying an image sensor 10 includes: a plastic packaging structure 30 disposed on the substrate 20 and surrounding the image sensor 10; and a transparent plastic window 40 disposed in the plastic packaging structure 30, and located directly above the image sensor 10, wherein a position of the transparent plastic window 40 projected on the substrate 20 corresponds to a position of the image sensor 10, and material of the transparent plastic window 40 includes a plastic and an additive, and the additive is selected from the group consisting of germanium, silicon, potassium bromide, potassium chloride, sodium chloride, zinc sulfide, and zinc selenide.

In accordance with an aspect of the present disclosure, the image sensor package 1 configured to package an image sensor 10 includes: a substrate 20 configured to carry the image sensor 10, a plastic packaging structure 30 disposed on the substrate 20 and surrounding the image sensor 10; and a transparent plastic window 40 disposed in the plastic packaging structure 30, and located directly above the image sensor 10, wherein a position of the transparent plastic window 40 projected on the substrate 20 corresponds to a position of the image sensor 10, and material of the transparent plastic window 40 includes a plastic and an additive, and the additive is selected from the group consisting of germanium, silicon, potassium bromide, potassium chloride, sodium chloride, zinc sulfide, and zinc selenide.

In terms of a plastic material composition of the transparent plastic window 40, the first object to consider is that the material used in the transparent plastic window 40 has to achieve the light transmission effect for the responsive spectrum range of the image sensor 10. Pure plastic material cannot have sufficient light transmission in the far infrared (e.g., 3-14 μm) region, which is the natural limitation of the molecular structures. Therefore, a certain additive (mixture) must be added, but it should be noted that after the additive (mixture) is added, there may be mixing unevenness, fragile structures, sensitivity to water vapor, and other various issues. The additive (mixture) added into the plastic material may be made of germanium, silicon, potassium bromide, sodium chloride, zinc sulfide, zinc selenide, etc. The above materials have desired light transmission effect for the far infrared region (e.g., 3-14 μm).

In accordance with some embodiments of the present disclosure, a material of the plastic packaging structure 30 includes a plastic, and the plastics of the plastic packaging structure 30 and the transparent plastic window 40 are selected from the group consisting of polycarbonate (PC), polymethyl methacrylate (PMMA), polyethylene (PE), high density polyethylene (HDPE), polypropylene (PP), polystyrene (PS), polyethylene terephthalate (PET). However, the plastic material includes, but not limited to, the above materials.

In accordance with some preferred embodiments of the present disclosure, the plastic packaging structure 30 and the substrate 20 are not integrally formed, but are two independent components. Furthermore, the materials of the plastic packaging structure 30 and the substrate 20 are different. In accordance with some preferred embodiments of the present disclosure, the substrate 20 may be a circuit board, a glass board, a ceramic board or a plastic board. In accordance with some preferred embodiments of the present disclosure, the substrate 20 is provided with a plurality of traces 25 electrically connected to the image sensor 1.

In accordance with some preferred embodiments of the present disclosure, a mass percentage of the additive (mixture) to the transparent plastic window 40 ranges from 2% to 10%. The mass percentage of the additive (mixture) in the transparent plastic window 40 must be at least 2%, so that the transparent plastic window 40 has sufficient light transmission effect for the far infrared (e.g., 3-14 μm) region. In addition, due to the cohesiveness of plastics, adding too much of the above powdery or granular additive (mixture) may affect the strength of the mixed plastic structure. Therefore, the mass ratio of the additive (mixture) should not be greater than 10% for maintaining the strength of the plastic structure.

Figure 5:
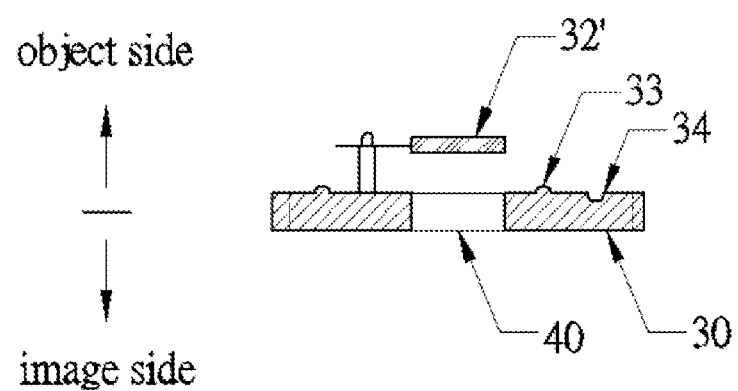
FIG. 5 is a cross-sectional side view showing a detailed structure of an image sensor package in accordance with another embodiment of the disclosure.

Refer to FIG. 3, which is a top view showing a top view structure of three types of the image sensor packages in accordance with some embodiments of the disclosure. Refer to FIG. 4, which is a cross-sectional side view (left part) and a top view (right part) showing a detailed structure of the image sensor package in accordance with an embodiment of the disclosure. Refer to FIG. 5, which is a cross-sectional side view showing a detailed structure of the image sensor package in accordance with another embodiment of the disclosure.

In accordance with some embodiments of the present disclosure, a top surface and a bottom surface of the transparent plastic window are planes, aspheric curved surfaces or Fresnel curved surfaces. In accordance with some embodiments of the present disclosure, shapes of a top surface and a bottom surface of the transparent plastic window are circles, squares or rectangles, as shown in FIG. 3.

In accordance with some embodiments of the present disclosure, the plastic packaging structure 30 includes an upper structure, and the upper structure is substantially parallel to the substrate 20, is located above the image sensor 10, and includes more than one air holes 31 configured to adjust a type and pressure of the gas contained inside the image sensor package 1 (i.e., a space formed between the plastic package structure 30 and the substrate 20), and after the adjustment, the air holes 31 are sealed to maintain the pressure and type of the gas in the package 1. Since the main material of the image sensor package 1 of the present disclosure is plastic, the thermal insulation effect of plastic in contact conduction is better than that of metal. Thus, the space sealed inside the package is unnecessary in the vacuum condition or unnecessarily filled with a special gas which is non-general air. Therefore, in accordance with some embodiments of the present disclosure, the inside of the image sensor package 1 is not a vacuum and contains gas.

The upper structure includes a shutter 32 configured to allow and block light from achieving the image sensor 10 (completely shielding light radiation, e.g. 100 nm-40000 nm) in an embodiment, or a band pass filter 32 configured to switch a spectral band pass in another embodiment. In accordance with an embodiment of the present disclosure, the shutter 32 or the band pass filter 32 is disposed on a side of the upper structure close to the image sensor 10, as shown in the left part of FIG. 4. In accordance with another embodiment of the present disclosure, the shutter 32' or a band pass filter 32' is disposed on a side of the upper structure away from the image sensor 10, as shown in FIG. 5.

In accordance with some embodiments of the present disclosure, the upper structure includes more than one positioning recesses 34 or positioning protrusions 33 configured to position the image sensor package 1 in place.

In accordance with some embodiments of the present disclosure, the plastic packaging structure includes a lateral side substantially being perpendicular to the substrate 20, and the lateral side includes more than one positioning grooves configured to position the image sensor package 1 in place, and center, align, and focus the image sensor and an lens.

It should be noted that various modifications in the number, position, and shape of the air holes 31, the shutter 32, the band pass filter 32, the positioning protrusions 33, the positioning recesses 34, and the positioning grooves 35 are within the scopes of the present disclosure.

In an embodiment of the present disclosure the image sensor 10 may be a charged-coupled device (CCD), or a complementary metal-oxide-semiconductor transistor (CMOS). The image sensor 10 is configured to convert light signals into electrical signals. The image sensor 10 is one selected from the group consisting of a ceramic leaded chip carrier package type image sensor, a plastic leaded chip carrier package type image sensor and a chip scale package type image sensor. However, various types of the image sensors 10 are only examples, and should not be regarded as limiting.

In summary, in accordance with an embodiment of the present disclosure, the image sensor package has the following three advantages: (1) plastic is used as the main package material for packaging the image sensor, and since plastic is cheep and can be easily formed, the cost is low, and the manufacturing process is fast; (2) the additive is added into the plastic to form a plastic mixture used as material of the transparent plastic window for making the image sensor have sufficient light transmittance in a far infrared region (e.g., 3-14 μm) (e.g., light transmittance exceeding 45%); (3) in a conventional image sensor package, air pressure in the space sealed inside the package must be controlled between 0 and 0.1 atmospheric pressure, but in the present disclosure, since plastic is used as the main material of the packaging structure, instead of common metals, and the thermal insulation effect of plastic on contact conduction is better than that of metals, the space sealed inside the package is unnecessary in the vacuum condition or unnecessarily filled with a special gas which is non-general air, thereby changing the packaging order in the supply chain.

The present disclosure has been described with a preferred embodiment thereof and it is understood that various modifications, without departing from the spirit of the present disclosure, are in accordance with the embodiments of the present disclosure. Hence, the embodiments described are intended to cover the modifications within the scope and the spirit of the present disclosure, rather than to limit the present disclosure.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. An image sensor package, comprising:
a plastic packaging structure; and
a transparent plastic window disposed in the plastic packaging structure, wherein a material of the transparent plastic window includes a plastic and an additive, and the additive is selected from the group consisting of germanium, silicon, potassium bromide, potassium chloride, sodium chloride, zinc sulfide, and zinc selenide.

2. The image sensor package as claimed in claim 1, wherein an inside of the image sensor package contains a gas.

3. The image sensor package as claimed in claim 1, wherein a material of the plastic packaging structure includes a plastic, and the plastics of the plastic packaging structure and the transparent plastic window are selected from the group consisting of polycarbonate (PC), polymethyl methacrylate (PMMA), polyethylene (PE), high density polyethylene (HDPE), polypropylene (PP), polystyrene (PS), polyethylene terephthalate (PET).

4. The image sensor package as claimed in claim 1, wherein a mass percentage of the additive to the transparent plastic window ranges from 2% to 10%.

5. The image sensor package as claimed in claim 1, wherein a top surface and a bottom surface of the transparent plastic window are planes, aspheric curved surfaces or Fresnel curved surfaces.

6. The image sensor package as claimed in claim 1, wherein shapes of a top surface and a bottom surface of the transparent plastic window are circles, squares or rectangles.

7. The image sensor package as claimed in claim 2, wherein the plastic packaging structure includes an upper structure including more than one air holes configured to adjust a type and pressure of the gas contained inside the image sensor package.

8. The image sensor package as claimed in claim 1, wherein the plastic packaging structure includes an upper structure including a shutter configured to allow and block light from entering the image sensor package, or a band pass filter, wherein the shutter or the band pass filter is disposed on an inner side and an outer side of the upper structure.

9. The image sensor package as claimed in claim 1, wherein the plastic packaging structure includes an upper structure including more than one positioning recesses or positioning protrusions configured to position the image sensor package in place.

10. The image sensor package as claimed in claim 1, wherein the plastic packaging structure includes a lateral side, and the lateral side includes more than one positioning grooves.

11. An image sensor package configured to package an image sensor, comprising:
a substrate configured to carry the image sensor, a plastic packaging structure disposed on the substrate and surrounding the image sensor; and
a transparent plastic window disposed in the plastic packaging structure, and located directly above the image sensor, wherein a position of the transparent plastic window projected on the substrate corresponds to a position of the image sensor, and a material of the transparent plastic window includes a plastic and an additive, and the additive is selected from the group consisting of germanium, silicon, potassium bromide, potassium chloride, sodium chloride, zinc sulfide, and zinc selenide.

12. The image sensor package as claimed in claim 11, wherein an inside of the image sensor package contains a gas.

13. The image sensor package as claimed in claim 11, wherein a material of the plastic packaging structure includes a plastic, and the plastics of the plastic packaging structure and the transparent plastic window are selected from the group consisting of polycarbonate (PC), polymethyl methacrylate (PMMA), polyethylene (PE), high density polyethylene (HDPE), polypropylene (PP), polystyrene (PS), polyethylene terephthalate (PET).

14. The image sensor package as claimed in claim 11, wherein a mass percentage of the additive to the transparent plastic window ranges from 2% to 10%.

15. The image sensor package as claimed in claim 11, wherein a top surface and a bottom surface of the transparent plastic window are planes, aspheric curved surfaces or Fresnel curved surfaces.

16. The image sensor package as claimed in claim 11, wherein shapes of a top surface and a bottom surface of the transparent plastic window are circles, squares or rectangles.

17. The image sensor package as claimed in claim 12, wherein the plastic packaging structure includes an upper structure, and the upper structure is substantially parallel to the substrate, is located above the image sensor, and includes more than one air holes configured to adjust a type and pressure of the gas contained inside the image sensor package.

18. The image sensor package as claimed in claim 11, wherein the plastic packaging structure includes an upper structure, and the upper structure is substantially parallel to the substrate, is located above the image sensor, and includes a shutter configured to allow and block light from achieving the image sensor, or the band pass filter, wherein the shutter or the band pass filter is disposed on a side of the upper structure close to or away from the image sensor.

19. The image sensor package as claimed in claim 11, wherein the plastic packaging structure includes an upper structure, and the upper structure is substantially parallel to the substrate, is located above the image sensor, and includes more than one positioning recesses or positioning protrusions configured to position the image sensor package in place.

20. The image sensor package as claimed in claim 11, wherein the substrate and the plastic packaging structure are independent of each other, and materials of the substrate and the plastic packaging structure are different.

* * * * *